(12) United States Patent
Kobayashi et al.

(10) Patent No.: US 6,402,594 B1
(45) Date of Patent: Jun. 11, 2002

(54) POLISHING METHOD FOR WAFER AND HOLDING PLATE

(75) Inventors: Daisuke Kobayashi, Kosyoku; Tsuyoshi Matsuzaki, Nakakubiki-gun; Hideo Kudo, Nishishirakawa-gun, all of (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/474,084

(22) Filed: Dec. 29, 1999

(30) Foreign Application Priority Data

Jan. 18, 1999 (JP) ............................. 11-009861

(51) Int. Cl.$^7$ ................................ B24B 1/00
(52) U.S. Cl. ..................... 451/41; 451/287; 451/397
(58) Field of Search ................. 451/41, 397, 398, 451/402, 387, 385, 287, 289, 288

(56) References Cited

U.S. PATENT DOCUMENTS

| | | | |
|---|---|---|---|
| 4,519,168 A | * 5/1985 | Cesna | 451/41 |
| 5,177,907 A | 1/1993 | Rothe et al. | |
| 5,520,568 A | * 5/1996 | Craighead et al. | 451/42 |
| 5,534,106 A | * 7/1996 | Cote et al. | 451/287 |
| 5,538,465 A | * 7/1996 | Netsu et al. | 451/289 |
| 5,584,746 A | * 12/1996 | Tanaka et al. | 451/41 |
| 5,788,560 A | * 8/1998 | Hashimoto et al. | 451/288 |
| 6,126,528 A | * 10/2000 | Sedlock | 451/41 |
| 6,142,853 A | 11/2000 | Freund et al. | |
| 6,217,417 B1 | * 4/2001 | Nakamura et al. | 451/41 |

FOREIGN PATENT DOCUMENTS

| | | |
|---|---|---|
| EP | 1 046 462 A | 10/2000 |
| JP | 53 111594 A | 9/1978 |
| JP | 04 017332 A | 1/1992 |

* cited by examiner

Primary Examiner—Joseph J. Hail, III
Assistant Examiner—Hadi Shakeri
(74) Attorney, Agent, or Firm—Oliff & Berridge, PLC

(57) ABSTRACT

A polishing method for wafer, comprises the steps of; adhering a wafer to a wafer adhesion part of a holding plate through a wax, and rubbing the wafer with a polishing pad, wherein grooves are formed on the wafer adhesion part and extend to the outside of the wafer adhesion part.

9 Claims, 3 Drawing Sheets

POLISHING METHOD FOR WAFER AND HOLDING PLATE

BACKGROUND OF THE INVENTION

1. Field of the Invention

The present invention relates to a holding plate to which a wafer is adhered through a wax, and a polishing method which is carried out by using the holding plate.

2. Description of the Related Art

A wafer is polished as follows. A wafer is adhered to a holding plate. The wafer is pressed against a polishing pad which is spread on a turn table, by the holding plate. The wafer is rubbed with the polishing pad. As a method in which the wafer is adhered to the holding plate, there are a wax-mounting polishing method and a waxless-mounting polishing method. As compared with the wax-mounting polishing method, the waxless-mounting polishing method has the advantages of good productivity and low cost because it is not necessary to carry out an adhesion operation in which the wafer is adhered to the holding plate and a separating operation in which the wafer is separated from the holding plate and the polished wafer is easily cleaned. However, in the waxless-mounting polishing method, there are problems about a flatness of the polished wafer, a local etching of a rear surface of the wafer, which is carried out by using an abrasive slurry, and the like. At present, the wax-mounting polishing method is used mainly.

In one wax-mounting polishing method, the wafer is chucked by a vacuum chucking apparatus to apply the wax to the rear surface of the wafer. The rear surface of the wafer is directed downwardly. The wafer chucked by the vacuum chucking apparatus is released near the holding plate to drop the wafer on the holding plate by a self-weight thereof. Thereby, the wafer is adhered to the holding plate. In another wax-mounting polishing method, the center portion of the rear surface of the wafer is pressed against the holding plate by a vacuum chucking apparatus into which an air pad is incorporated in a situation that the wafer to which the wax is applied remains chucked or in a situation that the wafer is curved. In this situation, the wafer chucked by the vacuum chucking apparatus is released. Thereby, the wafer is adhered to the holding plate. A holding plate which is made of glass, such as borosilicate glass or the like, or which is made of ceramics, such as alumina, silicon carbide or the like, is used. As the requirement for a flatness of a wafer becomes severe, a holding plate made of ceramics, which has a high rigidity is mainly used.

However, because the wafer has a warp, a flexure, an undulation or the like, bubbles are often sealed between the holding plate and the rear surface of the wafer after the adhesion. When there are bubbles between the holding plate and the rear surface of the wafer, part of the front surface of the wafer, which corresponds to the bubbles bulges out. When the wafer is polished, the part corresponding to the bubbles is polished more than the other parts of the front surface of the wafer. There is a problem that a dimple is caused in the wafer after the wafer is polished. Further, after the wafer is polished, a dimple is caused in the wafer partially by unevenly applying the wax to the wafer.

SUMMARY OF THE INVENTION

The present invention was developed in view of these problems.

An object of the present invention is to provide a holding plate having a construction in which bubbles are hard to be sealed between the holding plate and the rear surface of the wafer even by the wax-mounting polishing method and the thickness of the wax can be even, and to provide a polishing method in which the wafer can be polished by the holding plate so that the dimple is not caused after the wafer is polished.

That is, in accordance with an aspect of the present invention, the polishing method for wafer, comprises the steps of; adhering a wafer to a wafer adhesion part of a holding plate through a wax, and rubbing the wafer with a polishing pad, wherein grooves are formed on the wafer adhesion part and extend to the outside of the wafer adhesion part.

In such a polishing method, because the wafer is polished by using the holding plate in which the grooves are formed on the wafer adhesion part and extend to the outside of the wafer adhesion part, the air to be sealed between the wafer and the holding plate escapes to the outside of the wafer adhesion part through the grooves and is released into the atmosphere. Further, when the wax is unevenly applied to the wafer, the unnecessary wax flows into the grooves and the thickness of the wax becomes thin and even as a whole. As a result, after the wafer is adhered to the holding plate, it is prevented that the bubbles are sealed between the holding plate and the rear surface of the wafer and that the unnecessary wax gathers therebetween. The dimple can be prevented from being caused.

The grooves may be formed on the whole wafer adhesion part. The grooves may be formed at least on a portion of the wafer adhesion part, which is distant over a half of a radius of the wafer from a center of the wafer adhesion part.

In accordance with another aspect of the present invention, the polishing method for wafer, comprises the steps of; adhering a wafer to a wafer adhesion part of a holding plate through a wax, and rubbing the wafer with a polishing pad, wherein a surface roughness of at least a portion of the wafer adhesion part, which is distant over a half of a radius of the wafer from a center of the wafer adhesion part and that of a peripheral portion of the wafer adhesion part are approximately uniform, and an average roughness of the portion of the wafer adhesion part and that of the peripheral portion of the wafer adhesion part are from 0.5 to 1.5 $\mu$m.

In such a polishing method, because the surface roughness is approximately uniform, and the average roughness is 0.5 to 1.5 $\mu$m, the air to be sealed between the wafer and the holding plate easily escapes to the outside of the wafer adhesion part and is dispersed by many concaves between the wafer and the holding plate. As a result, after the wafer is adhered to the holding plate, it is prevented that the bubbles are sealed between the holding plate and the rear surface of the wafer. When the wax is unevenly applied to the wafer, the unnecessary wax flows into many concaves and the thickness of the wax becomes thin and even as a whole. As a result, an excellent polishing can be carried out without causing the dimple.

In accordance with another aspect of the present invention, a holding plate comprises; a wafer adhesion part for adhering a wafer through a wax, and grooves which are formed on the wafer adhesion part and extend to the outside of the wafer adhesion part.

In such a holding plate, because the grooves are formed on the wafer adhesion part and extend to the outside of the wafer adhesion part, when the wafer is adhered to the holding plate, the air to be sealed between the wafer and the holding plate easily escapes to the outside of the wafer adhesion part through the grooves. Further, when the wax is unevenly applied to the wafer, the unnecessary wax flows into the grooves and the unevenness of the thickness of the wax can be cleared. As a result, after the wafer is adhered to the holding plate, it is prevented that the bubbles are sealed between the holding plate and the rear surface of the wafer and that the unnecessary wax gathers therebetween. The thickness of the wax becomes even as a whole.

The grooves may be formed on the whole wafer adhesion part. The grooves may be formed at least on a portion of the wafer adhesion part, which is distant over a half of a radius of the wafer from a center of the wafer adhesion part.

The grooves may be formed in a grid shape, in a linear shape or in a concentrically circular shape, on the whole wafer adhesion surface of the holding plate.

The width of the grooves may be from 5 to 2000 $\mu$m. The depth of the grooves may be from 2 to 500 $\mu$m. The pitch of the grooves may be from 1 to 15 mm.

In accordance with another aspect of the present invention, a holding plate comprises; a wafer adhesion part for adhering a wafer through a wax, wherein a surface roughness of at least a portion of the wafer adhesion part, which is distant over a half of a radius of the wafer from a center of the wafer adhesion part and that of a peripheral portion of the wafer adhesion part are approximately uniform, and an average roughness of the portion of the wafer adhesion part and that of the peripheral portion of the wafer adhesion part are from 0.5 to 1.5 $\mu$n.

In such a holding plate, because the surface roughness of at least the portion of the wafer adhesion part, which is distant over a half of a radius of the wafer from a center of the wafer adhesion part of the wafer adhesion surface and that of a peripheral portion of the wafer adhesion part are approximately uniform, and the average roughness thereof are 0.5 to 1.5 $\mu$m, the air to be sealed between the wafer and the holding plate easily escapes to the outside of the wafer adhesion part and is dispersed by many concaves between the wafer and the holding plate. As a result, a polishing can be carried out without causing the dimple. When the wax is unevenly applied to the wafer, the unnecessary wax flows into many concaves and the thickness of the wax becomes thin and even as a whole.

According to the present invention, because the polishing method for wafer is carried out by adhering a wafer to a wafer adhesion part of a holding plate through a wax, and by rubbing the wafer with a polishing pad, wherein grooves are formed on the wafer adhesion part and extend to the outside of the wafer adhesion part, the air to be sealed between the wafer and the holding plate escapes to the outside of the wafer adhesion part through the grooves. Further, the unnecessary wax flows into the grooves. As a result, a polishing can be carried out without causing the dimple.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein;

FIG. 4 is a view for explaining the area for forming the grooves of the holding plate or the like;

PREFERRED EMBODIMENT OF THE INVENTION

Figure 1:
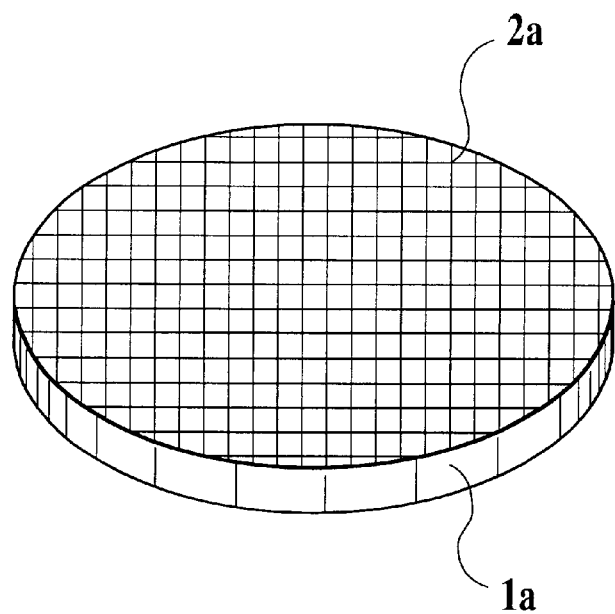
FIG. 1 is a perspective view showing the rear surface side of the holding plate according to the first embodiment.

FIG. 1 is a perspective view showing the rear surface side of the holding plate according to the first embodiment. The holding plate 1a is a block made of ceramics. Grooves 2a are formed in a grid shape on the whole rear surface thereof (wafer adhesion surface).

Figure 2:
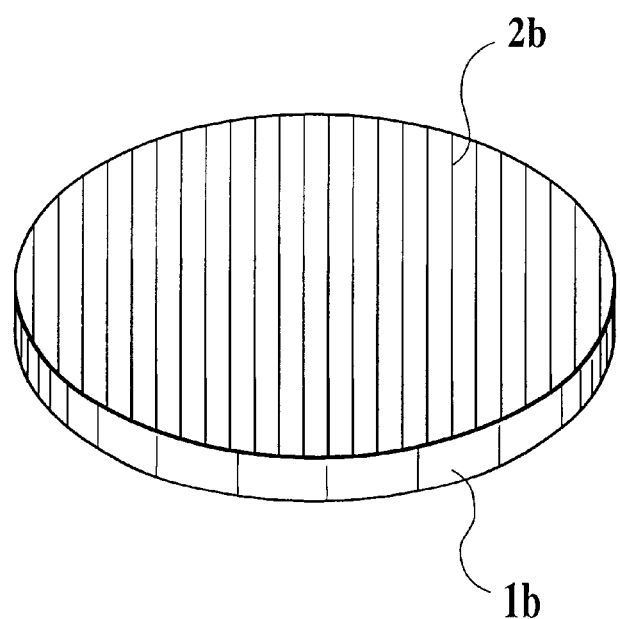
FIG. 2 is a perspective view showing the rear surface side of the holding plate according to the second embodiment.

FIG. 2 is a perspective view showing the rear surface side of the holding plate according to the second embodiment. The holding plate 1b is a block made of ceramics. A large number of grooves 2b are formed in a linear shape on the whole rear surface thereof.

Figure 3:
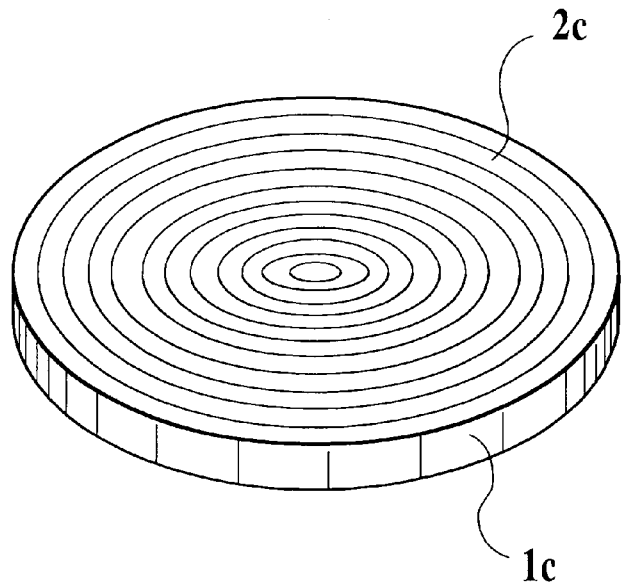
FIG. 3 is a perspective view showing the rear surface side of the holding plate according to the third embodiment.

FIG. 3 is a perspective view showing the rear surface side of the holding plate according to the third embodiment. The holding plate 1c is a block made of ceramics. Grooves 2c are formed in a concentrically circular shape on the whole rear surface thereof.

With respect to the size of grooves 2a to 2c, the width of the grooves is from 5 $\mu$m to 2000 $\mu$m. The depth thereof is from 2 $\mu$m to 500 $\mu$m. The pitch is preferably from 1 mm to 15 mm. The reason why the upper limit of the width of the grooves is 2000 $\mu$m is that when the width thereof exceeds the upper limit, the possibility that the shape of the groove is transferred to the wafer by the polishing becomes high. On the other hand, the reason why the lower limit of the width of the grooves is 5 $\mu$m is that when the width thereof is less than the lower limit, the bubbles are sealed between the wafer and the holding plate and an unnecessary wax are hard to escape to the grooves. The reason why the upper limit of the depth of the grooves is 500 $\mu$m is that even though the depth thereof exceeds the upper limit, it is not desired to improve the effect more than the case in which the depth does not exceed the upper limit. Further, when the depth exceeds the upper limit, the holding plate is hard to be cleaned. On the other hand, the reason why the lower limit of the depth of the grooves is 2 $\mu$m is that when the depth thereof is less than the lower limit, the bubbles and the unnecessary wax are hard to escape to the grooves. Although the pitch thereof may be changed according to the size of bubble which is introduced when the wafer is adhered, that is, according to the size of the dimple of the wafer after the polishing, the reason why the upper limit of the pitch of the grooves is 15 mm is that when the pitch thereof exceeds the upper limit, the grooves cannot cover all of the bubble generation parts and all of the gathered wax. On the other hand, the reason why the lower limit of the pitch of the grooves is 1 mm is that when the pitch thereof is less than the lower limit, the edges of the grooves are easily broken. It is preferable that the portion which is the rear surface of the holding plate except the groove portion thereof is as flat as possible. Preferably, the average roughness thereof is 0.40 $\mu$m and the standard deviation thereof is 0.03 $\mu$m, or the roughness thereof is smaller than the above roughness.

Figure 4:
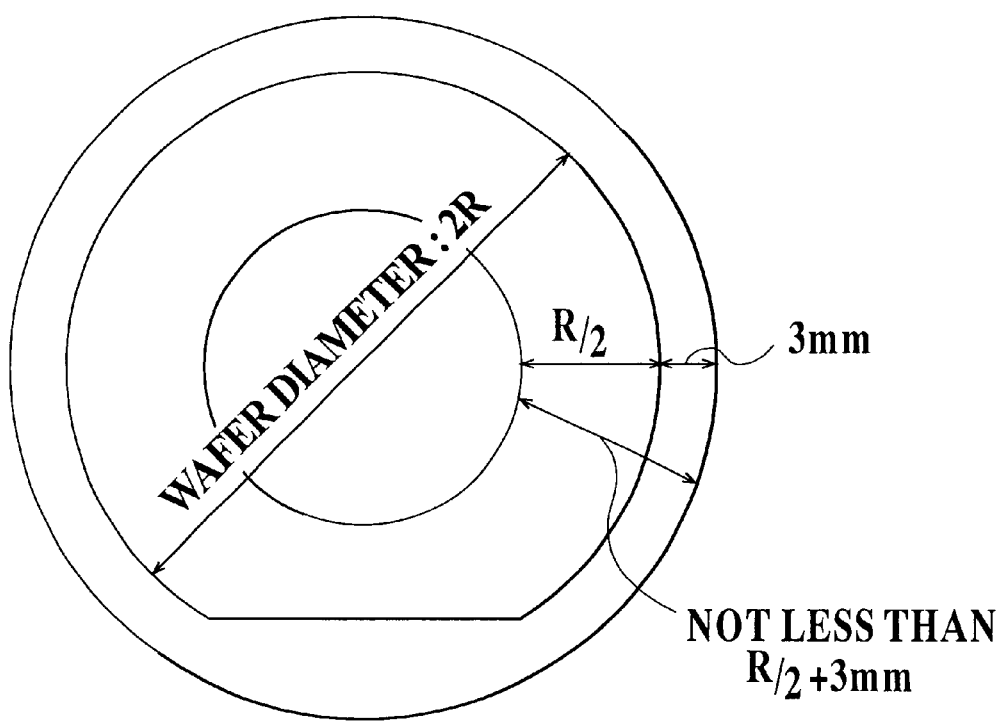

Although in these embodiments, the grooves are formed in a grid shape or the like on the whole rear surface of the holding plate, the grooves may be formed on the rear surface of the holding plate partially. In this case, as shown in FIG. 4, the grooves are formed at least on a portion of the wafer adhesion part, which is distant over the half of the radius of the wafer from the center of the wafer adhesion part of the wafer adhesion surface, preferably. From the experience, there is much possibility that the dimple of the wafer, which is considered to be caused by the bubbles and the gathered wax exists in the portion of the wafer adhesion part, which is distant over the half of the radius of the wafer from the center of the wafer adhesion part of the wafer adhesion surface. In this case, it is necessary that at least the grooves extend to the outside of the wafer adhesion part. The present invention is not especially limited to the extent of the grooves. When the grooves extend to the outside of the wafer adhesion part about 3 mm, the extent of the grooves is sufficient to remove the sealed bubbles and the unnecessary wax.

The holding plate may be manufactured by a known method. In case of glass, a plate having a desired thickness is prepared. The plate is cut off so as to have a desired shape. Then, a holding plate having a disk shape is manufactured. In case of ceramics, a sintering agent and a binder are added to a material powder, such as alumina, silicon carbide, if necessary. The material powder is formed and is sintered at a predetermined temperature. Then, the holding plate having a disk shape is manufactured. With respect to a process of grooves, the grooves may be formed by a known mechanical process or the like. In case of ceramics, in consideration of a shrinkage of a holding plate during the sintering, when the material powder is formed, the grooves are formed on the material powder. Then, the formed material powder can be sintered.

Figure 5:
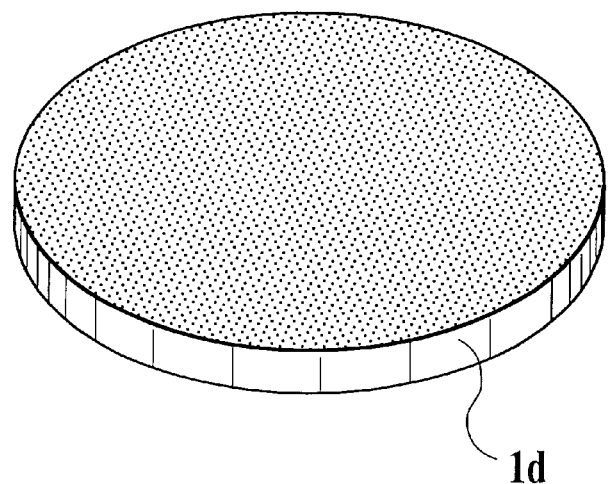
FIG. 5 is a perspective view showing the rear surface side of the holding plate according to the fourth embodiment.

FIG. 5 is a perspective view showing the rear surface side of the holding plate according to the fourth embodiment. The holding plate id is a block made of ceramics. In the holding plate 1d, the surface roughness of the whole wafer adhesion surface is approximately uniform and the average roughness thereof is from 0.5 $\mu$m to 1.5 $\mu$m.

The reason why the average roughness is 0.5 $\mu$m to 1.5 $\mu$m will be explained. The reason why the upper limit of the average roughness is 1.5 $\mu$m is that when the average roughness exceeds the upper limit, the flatness of the surface of the wafer is damaged after the wafer is polished. On the other hand, the reason why the lower limit of the average roughness is 0.5 $\mu$m is that when the average roughness is less than lower limit, the air and the unnecessary wax are hard to escape to the concaves of the holding plate 1d.

Although in this embodiment, the average roughness of the whole rear surface of the holding plate is from 0.5 $\mu$m to 1.5 $\mu$m, the average roughness of a portion of the rear surface of the holding plate may be from 0.5 $\mu$m to 1.5 $\mu$m. In this case, as shown in FIG. 4, the average roughness of at least the portion of the wafer adhesion part, which is distant over the half of the radius of the wafer from the center of the wafer adhesion part of the wafer adhesion surface and that of the peripheral portion of the wafer adhesion part are from 0.5 $\mu$m to 1.5 $\mu$m, preferably. The reason therefor is the same as the above description. In order to carry out a surface roughening in which the average roughness of the holding plate is from 0.5 $\mu$m to 1.5 $\mu$m, a lapping or the like, which is a known method may be carried out.

The wafer is adhered to the above holding plates 1a to 1d by the wax-mounting method according to the earlier technique.

Figure 6:
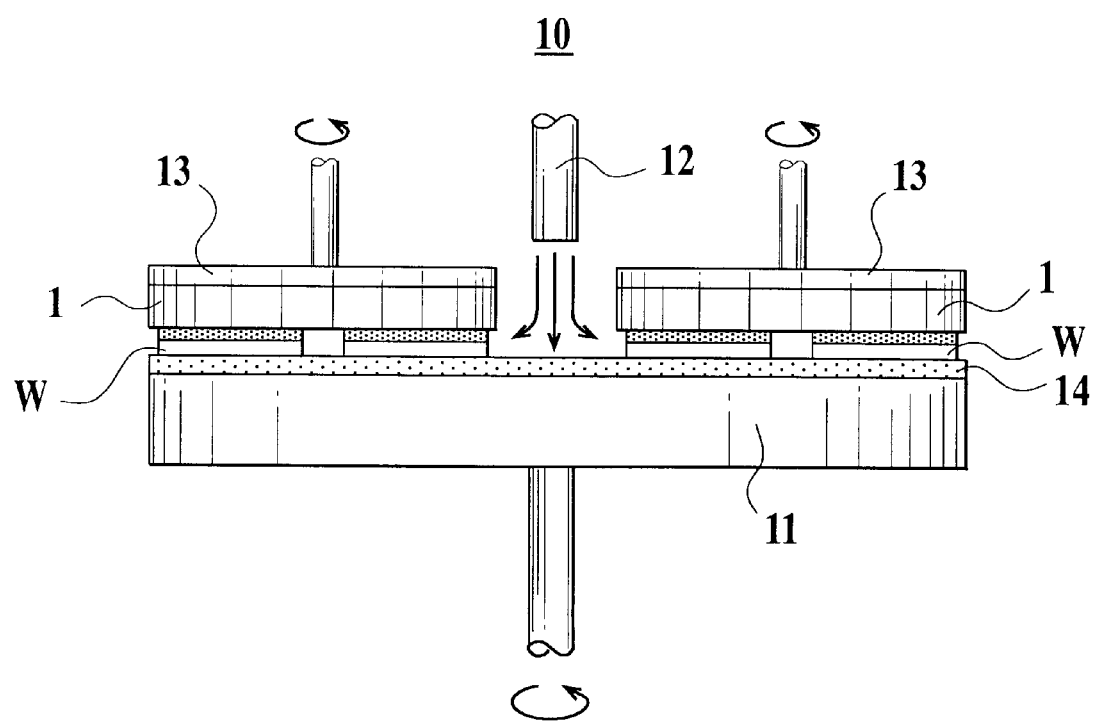
FIG. 6 is a schematic side view of the polishing apparatus.

Next, the polishing method which is carried out by using these holding plates 1a to 1d will be explained. In the polishing method, a polishing apparatus 10 shown in FIG. 6 is used. The polishing apparatus 10 comprises a turn table 11, an abrasive slurry supplying member 12, a top ring 13, a top ring rotating member (not shown in the figure) and a turn table rotating member (not shown in the figure).

When the adhesion of the wafer to the holding plate 1 (1a to 1d) finishes, the holding plate 1 is located under the top ring 13 to contact the wafer W with the polishing pad 14 spread on the turn table 11. The top ring 13 is lowered to press the wafer W against the polishing pad 14 through the holding plate 1. While the top ring rotating member and the turn table rotating member are driven, the abrasive slurry is supplied from a nozzle of the abrasive slurry supplying member 12 to polish the wafer W. When the polishing is finished, the top ring 13 is raised to take out the holding plate 1. Then, the wafer W is separated from the holding plate 1.

EXAMPLE

An alumina sintered body having a diameter of 630 mm and a thickness of 20 mm, on which grooves having a width of 100 $\mu$m, a depth of 15 $\mu$m, and a pitch of 3 mm, were formed in a grid shape as shown in FIG. 1, was used as a holding plate. With respect to the roughness of the portion which is the rear surface of the holding plate except the groove portion thereof, the average roughness thereof was 0.4 $\mu$m and the standard deviation thereof was 0.03 $\mu$m. The wafers were polished as follows to evaluate the holding plate.

(1) The "sky liquid" made by Nikka Seiko Co. Ltd. was used as a wax. Seven 8-inches wafers adhered to the holding plate.

(2) By using the polishing apparatus, a pressure was applied to the holding plate to which the wafers were adhered. While the abrasive slurry was supplied, the wafers were polished about 10 $\mu$m by the polishing pad. In this case, a colloidal silica was used as an abrasive slurry. An unwoven cloth made of urethane was used as a polishing pad.

(3) After the polishing was finished, the wafers were separated from the holding plate. The wafers were cleaned.

(4) By using a flatness measurement apparatus (ADE9600), it was examined whether a dimple was caused or not.

The number of the examined wafers was 140. The wafers were polished under the same conditions.

As a result, the dimple was not caused on the surfaces of the wafers at all.

Further, as a holding plate, an alumina sintered body having no grooves, which has a diameter of 630 mm and a thickness of 20 mm and in which the average roughness is within the range of the present invention, was used. The 140 wafers which were polished under the same conditions as the above description were examined. The average roughness of the holding plate which was to be used in the experiment, was measured by using the "handy surf E-30A" made by Tokyo Seimitsu Co. Ltd. As a concrete method, the surface of the holding plate was divided by 5 lines 36 degree each. The average roughness was measured in 5 segments having a length of 4 mm on the respective lines at fixed intervals, that is, a total of 25 segments. As a result, the mean value of the average roughness of each segment was 1.00 $\mu$m. The standard deviation thereof was 0.15 $\mu$m. The cycle of the main roughness component was several tens $\mu$m.

The surfaces of the 140 wafers which were polished by using the above holding plate were examined. As a result, the dimple was not caused at all.

On the other hand, when the wafer was polished by using a holding plate having no grooves, which was made of alumina, according to the earlier technique, the rate of causing a dimple was about 12 to 15%. In this case, the average roughness of the holding plate according to the earlier technique was 0.40 μm. The standard deviation thereof was 0.03 μm. The method for measuring the average roughness is the same as the above described method.

Although the present invention has been explained according to the embodiments, it should also be understood that the present invention is not limited to the embodiments and that various changes and modifications may be made to the invention without departing from the gist thereof.

The entire disclosure of Japanese Patent Application No. Tokugan-Hei 11-9861 filed on Jan. 18, 1999 including specification, claims drawings and summary are incorporated herein by reference in its entirety.

What is claimed is:

1. A polishing method for a wafer, comprising:

adhering the wafer to a wafer adhesion part of a holding plate through a wax, wherein the holding plate is made of glass or ceramic, wherein the wafer adhesion part comprises grooves that extend to an outside of the wafer adhesion part, and rubbing the wafer with a polishing pad;

wherein a width of the grooves is from 5 to 2000 μm, a depth of the grooves is from 2 to 500 μm, and a pitch of the grooves is from 1 to 15 mm.

2. The polishing method as claimed in claim 1, wherein the wafer adhesion part is completely grooved.

3. The polishing method as claimed in claim 1, wherein a grooved portion of the wafer adhesion part is located on the wafer adhesion part over a half of a radius of the wafer from a center of the wafer adhesion part.

4. A holding plate comprising:

a wafer adhesion part on a surface of the holding plate for adhering a wafer through a wax, and grooves which are formed on the wafer adhesion part and extend to an outside of the wafer adhesion part; and wherein the holding plate is made of glass or ceramic;

wherein a width of the grooves is from 5 to 2000 μm, a depth of the grooves is from 2 to 500 μm, and a pitch of the grooves is from 1 to 15 mm.

5. The holding plate as claimed in claim 4, wherein the wafer adhesion part is completely grooved.

6. The holding plate as claimed in claim 4, wherein the groves are formed at least on a portion of the wafer adhesion part, which is located on the wafer adhesion part over a half of a radius of the wafer from a center of the wafer adhesion part.

7. The holding plate as claimed in claim 5, wherein the grooves are formed in a grid shape.

8. The holding plate as claimed in claim 5, wherein the grooves are formed in a linear shape.

9. The holding plate as claimed in claim 5, wherein the grooves are formed in a concentrically circular shape.

* * * * *